(12) United States Patent
Miike

(10) Patent No.: US 6,266,293 B1
(45) Date of Patent: Jul. 24, 2001

(54) SEMICONDUCTOR MEMORY DEVICE

(75) Inventor: Shogo Miike, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/640,821

(22) Filed: Aug. 17, 2000

(30) Foreign Application Priority Data

Aug. 20, 1999 (JP) ................................. 11-233567

(51) Int. Cl.[7] ....................................... G11C 8/00
(52) U.S. Cl. ............................ 365/230.08; 365/189.04; 365/230.03
(58) Field of Search ................. 365/230.08, 230.03, 365/189.04, 189.05

(56) References Cited

U.S. PATENT DOCUMENTS

| 5,539,696 | * | 7/1996 | Patel ................. | 365/230.03 |
| 5,732,017 | * | 3/1998 | Schumann et al. ............. | 365/185.11 |
| 5,742,554 | * | 4/1998 | Fujioka ........................ | 365/230.08 |
| 5,970,021 | * | 10/1999 | Sakurai ........................ | 365/233 |
| 6,061,294 | * | 5/2000 | Koshikawa ..................... | 365/194 |

FOREIGN PATENT DOCUMENTS

| 5-54682 | 3/1993 | (JP) . |
| 7-85657 | 3/1995 | (JP) . |
| 10-326493 | 12/1998 | (JP) . |
| 11-86576 | 3/1999 | (JP) . |
| 11-134887 | 5/1999 | (JP) . |

* cited by examiner

*Primary Examiner*—Son T. Dinh

(57) ABSTRACT

There is provided a non-volatile semiconductor memory device including a memory cell array arranged in a plurality of banks such that while data is erased from or written into one of the banks, data can be read out of one of the rest of the banks, the non-volatile semiconductor memory device including (a) a first switch receiving an external address through an address signal path through which data is to be read out of a first bank, (b) a second switch receiving an external address through an address signal path through which data is to be read out of a second bank, and (c) a latch circuit alternatively receives an external address as an address for writing data or an internal address for erasing data. An address transmitted from the latch circuit is supplied to both the first and second switches. Each of the first and second switches includes an address buffer circuit which transmits a bank address to an address decoder associated with each of the banks in accordance with a control signal transmitted from each of the banks, in dependence on whether each of the banks is in a data-reading operation, a data-writing operation, or a data-erasing operation. The bank address is comprised of an address for reading data, an address for writing data, or an address for erasing data.

14 Claims, 10 Drawing Sheets

SEMICONDUCTOR MEMORY DEVICE

BACKGROUND OF THE INVENTION

1. Field of the Invention

The invention relates to a semiconductor memory device, and more particularly to a semiconductor memory device including a memory cell array arranged in a plurality of banks.

2. Description of the Related Art

A flash memory is one of electrically erasable and programmable read only memories (EEPROM), and is able to erase data stored therein, in a unit of sectors or blocks, In a memory cell array of such a flash memory, each of memory cell transistors is designed to have a floating gate, a control gate electrically connected to a word line extending from an X decoder, a drain electrically connected to a bit line and further to a data reading and writing circuit through a Y switch which is turned on or off by means of a Y decoder, and a source electrically connected to sources of other memory cells in the same sector and further to a source line control circuit which is called a source line switch or a source decoder circuit.

When programmed, a predetermined high voltage Vpp is applied to a control gate of a memory cell transistor, a voltage of about 5V is applied to a drain, and a source is grounded, to thereby introduce electrons into a floating gate.

When data is to be erased, a drain is made open, a control gate is grounded, and a voltage Vpp is applied to a source, to thereby draw electrons out of a floating gate.

When data is to be read out, a memory cell located at an intersection of a word line selected by an X decoder and a bit line electrically connected to a Y switch selected by a Y decoder is accessed. A current running through the bit line in accordance with a threshold voltage is read out through a data-reading circuit.

FIG. 1 is a block diagram of a conventional flash memory. The illustrated flash memory is comprised of a first stage circuit 301, first and second transfer gates TG1 and TG2, a latch circuit 302 comprised of first and second inverters INV1 and INV2, and an inversion buffer INV3.

In the illustrated conventional flash memory, a memory cell array is generally designed to be arranged in a single bank. Hence, an address buffer which is designed to transmit an address signal to an X decoder circuit, a Y decoder circuit, and a source line control circuit, receives an external address and outputs the received external address as it is to the decoders.

Specifically, an external address signal is transmitted to an address decoder (not illustrated) as follows.

First, an external address signal is input into the first stage circuit 301, and then, input into the latch circuit 302 through the second transfer gate TG2 which is turned on or off in accordance with a latch control signal. An internal address is input into the latch circuit 302 through the first transfer gate TG1 which is turned on when a data-erase flag is activated. The latch circuit 302 transmits an address buffer output signal to the address decoder through the inversion buffer INV3.

The latch circuit 302 is comprised of the first and second inverters INV1 and INV2. An output terminal of the first inverter INV1 is electrically connected to an input terminal of the second inverter INV2, and an output terminal of the second inverter INV2 is electrically connected to an input terminal of the first inverter INV1. The first inverter INV1 is comprised of a clocked inverter which is turned on or off in accordance with a latch control signal.

When a stand-by control signal is activated in the first stage circuit 301, a current is disallowed to flow through the first stage circuit 301 regardless of a level of the external address.

When data is written into or read out of the flush memory, the latch control signal is activated, and the latch circuit 302 latches the external address input and transmits an address signal to the decoder circuit (not illustrated).

Data is automatically erased in the chip. Specifically, an internal address produced in the chip is input into the latch circuit 302 through the transfer gate TG1 which is turned on when the data-erase flag is activated, and further into the source line control circuit. As a result, data is erased in each of the sectors.

The flash memory including the address buffer having the above-mentioned structure cannot read out data while the flash memory is writing data into or erasing data from a memory cell.

Recently, there has been suggested a semiconductor memory device including memory cells arranged in a plurality of banks. However, such a semiconductor memory device is accompanied with a problem that it is necessary to carry out address control in each of the banks, and hence, it is not avoidable for the semiconductor memory device to have an increased size.

If a flash memory is designed to have an arrangement where memory cells are arranged in a plurality of banks, the flush memory would be accompanied with the same problem as mentioned above.

For instance, Japanese Unexamined Patent Publication No. 11-86576 has suggested a flash memory including a memory cell array partitioned into two blocks, and data-reading circuits each associated with each of the memory cell blocks. Even when data is erased from the written into one of the memory cell blocks, data can be read out of or written into the other memory cell block. That is, the suggested flush memory has a function of dual operation.

In comparison with a flash memory having no function of dual operation, the suggested flash memory having the dual operation is designed to further include first and second data-reading circuits each associated with each of the memory cell blocks, a circuit for judging an address, a first multiplexer receiving outputs from the first and second data-reading circuits and transmitting an output to an output buffer circuit, and a second multiplexer receiving outputs from the first and second data-reading circuits and transmitting an output to a circuit for judging data is to be written into or erased from the memory.

The suggested flash memory can vary a bit arrangement in each of the memory cell blocks without an increase in complexity in a circuit and an increase in a chip area.

Japanese Unexamined Patent Publication No. 5-54682 has suggested a non-volatile semiconductor memory device including memory cells arranged in a plurality of blocks. The suggested semiconductor memory device can simultaneously erase data from one of the memory cell blocks and read data out of other memory cell block.

Japanese Unexamined Patent Publication No. 7-85657 has suggested a semiconductor memory device which is capable of reducing a peak current during flush-writing data, to thereby reduce consumption in a current.

Japanese Unexamined Patent Publication No. 10-326493 has suggested a flash memory device which is capable of simultaneously writing data thereinto or erasing data therefrom, and reading data out thereof.

Japanese Unexamined Patent Publication No. 11-134887 has suggested a column decoder circuit used for a flash memory circuit. The column decoder circuit has word lines partitioned into a plurality of blocks.

However, since the above-mentioned devices cannot switch addresses or blocks, the devices are accompanied with a problem that an address control has to be carried out in each of the addresses or blocks, and resultingly, it is not avoidable for the devices to be larger in a size.

SUMMARY OF THE INVENTION

In view of the above-mentioned problem in a conventional flush memory devices, it is an object of the present invention to provide a semiconductor memory device including memory cells arranged in a plurality of banks which device can be fabricated in a smaller size than the conventional one.

There is provided a semiconductor memory device including (a) a plurality of address recorders each associated with each of a plurality of banks, and (b) at least one address buffer circuit receiving an address signal as an input signal, and transmitting a bank address signal to each of the address recorders, the address buffer circuit transmitting a first address signal for reading data, a second address signal for writing data, or a third signal for erasing data to each of the banks in accordance with an operation of reading data, an operation of writing data, or an operation of erasing data to be carried out by each of the banks.

It is preferably that the semiconductor memory device further includes a latch circuit, and wherein the second address signal is comprised of a latch address obtained by latching an externally input address signal by means of the latch circuit, and the third address signal is comprised of an internal address generated in the semiconductor memory device, the latch circuit switching and latching the latch and internal addresses.

It is preferable that the semiconductor memory device further includes a latch circuit, and wherein each of the first and second address signals is comprised of a latch address obtained by latching an externally input address signal by means of the latch circuit, and the third address signal is comprised of an internal address generated in the semiconductor memory device, the latch circuit switching and latching the latch and internal addresses.

For instance, the semiconductor memory device may be an electrically erasable and programmable read only memory (EEPROM).

There is further provided a non-volatile semiconductor memory device including a memory cell array arranged in a plurality of banks such that while data is erased from or written into one of the banks, data can be read out of one of the rest of the banks, the non-volatile semiconductor memory device including (a) a first switch receiving an external address through a first address signal path through which data is to be read out of a first bank, (b) a second switch receiving an external address through a second address signal path through which data is to be read out of a second bank, and (c) a latch circuit alternatively receives an external address as an address for writing data or an internal address as an address for erasing data, an address transmitted from the latch circuit being supplied to both the first and second switches, each of the first and second switches including an address buffer circuit which transmits a bank address to an address decoder associated with each of the banks in accordance with a control signal transmitted from each of the banks, in dependence on whether each of the banks is in a data-reading operation, a data-writing operation, or a data-erasing operation, the bank address being comprised of an address for reading data, an address for writing data, or an address for erasing data.

There is still further provided a non-volatile semiconductor memory device including a memory cell array comprised of first and second banks such that while data is erased from or written into one of the first and second banks, data can be read out of the other, the non-volatile semiconductor memory device including (a) first and second signal paths through each of which an external address is transmitted to each of the banks as an address for data-reading, and (b) a third signal path through which the external address or a latch address obtained by latching an internal address for data-erasing, by means of a latch circuit, is transmitted, an output transmitted through the third signal path being transmitted to an associated bank through an output terminal of at least one of the first and second signal paths, as an address, when data is to be written into or erased from the bank.

There is yet further provided a non-volatile semiconductor memory device including a memory cell array comprised of first and second banks such that while data is erased from or written into one of the first and second banks, data can be read out of the other, the non-volatile semiconductor memory device including (a) a first switch which is turned on when data is read out of the first bank and turned off when data is written into or erased from the first bank, (b) a second switch which is turned on when data is read out of the second bank and turned off when data is written into or erased from the second bank, (c) a third switch which is turned on when data is read out of both the first and second banks, (d) a fourth switch which is turned on when data is erased from the first and/or second bank, (e) a fifth switch which is turned on when data is written into or erased from the first bank, (f) a sixth switch which is turned on when data is written into or erased from the second bank, (g) a latch circuit, and (h) an address buffer circuit including a first buffer circuit and a second buffer circuit, each of the first and second buffer circuits transmitting a bank address to each of address decoders associated with the first and second banks, and externally input address being transmitted to an input terminal of the first buffer circuit through the first switch in accordance with a first bank switch signal, and further transmitted to an input terminal of the second buffer circuit through the second switch in accordance with a second bank switch signal, the externally input address being transmitted to an input terminal of the latch circuit through the third switch in accordance with the first and second bank switch signals, an internal address being transmitted to an input terminal of the latch circuit through the fourth switch in accordance with a control signal, an output signal being transmitted from the latch circuit to an input terminal of the first buffer circuit through the fifth switch in accordance with the first bank switch signal, and further transmitted to an input terminal of the second buffer circuit through the sixth switch in accordance with the second bank switch signal.

For instance, each of the first and second switches may be comprised of a clocked inverter. As an alternative, each of the first to sixth switches may be comprised of a transfer gate.

It is preferable that the non-volatile semiconductor memory device may be an electrically erasable and programmable read only memory (EEPROM).

There is still yet further provided a non-volatile semiconductor memory device including a memory cell array comprised of first and second banks, the non-volatile semiconductor memory device including (a) a first switch which is turned on when data is read out of the first bank and turned off when data is written into or erased from the first bank, (b) a second switch which is turned on when data is read out of the second bank and turned off when data is written into or erased from the second bank, (c) a third switch which is turned on when data is erased from the first and/or second banks, (d) a fourth switch which is turned on when data is erased from the first and/or second bank, (e) a first latch circuit, (f) a second latch circuit, and (g) an address buffer circuit including a first buffer circuit and a second buffer circuit, the first and second buffer circuits having input terminals electrically connected to output terminals of the first and second latch circuits, respectively, each of the first and second buffer circuits transmitting a bank address to each of address decoders associated with the first and second banks, respectively, an externally input address being transmitted to an input terminal of the first latch circuit through the first switch in accordance with a first bank switch signal, and further transmitted to an input terminal of the second latch circuit through the second switch in accordance with a second bank switch signal, an internal address being transmitted to each of input terminals of the first and second latch circuits through the third and fourth switches, respectively, in a accordance with a control signal.

The advantage obtained by the aforementioned present invention will be described hereinbelow.

The first advantage is that it is possible to reduce a load exerting on a data-reading route, reduce the number of stage between a first stage to a final stage for outputting an address, and hence, enhance an access rate, because, with respect to data about three addresses of an external address, a latch address, and an internal address, the latch and internal addresses are transmitted through the same route, when an output is switched into each of banks.

The second advantage is that the latch circuit for latching the internal and external addresses is arranged commonly for two banks, ensuring a smaller size in the semiconductor memory device.

The third advantage is that since a switch for switching between a latch circuit for latching an external address and a latch circuit for latching an internal address is arranged for each of banks, it is possible to separately latch an address in each of banks. As a result, it is possible to simultaneously write data into or erase data from one of banks, and read data out of, write data into, or erase data from the other bank.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
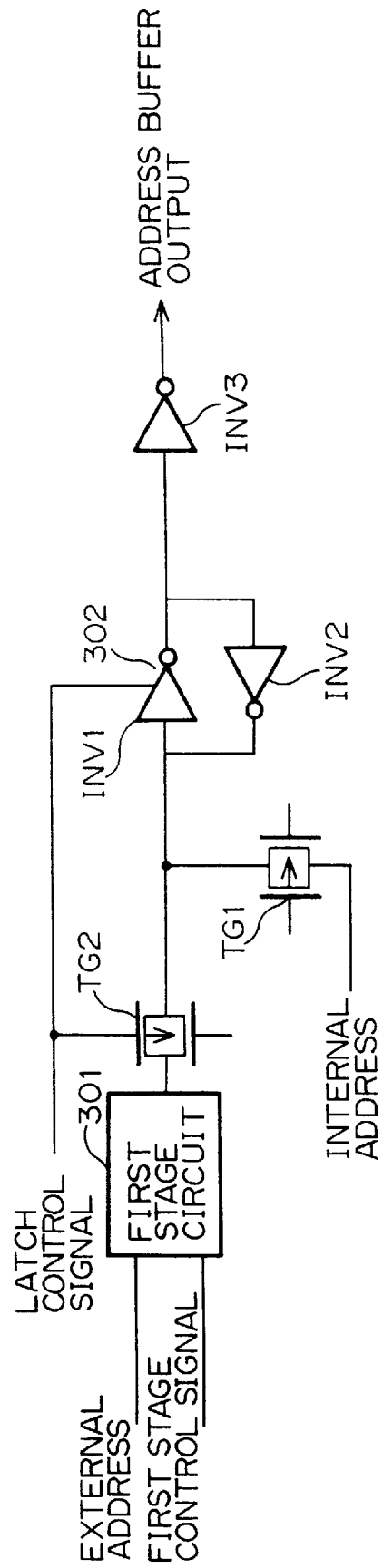
FIG. 1 is a block diagram of a conventional flash memory.
Figure 2:
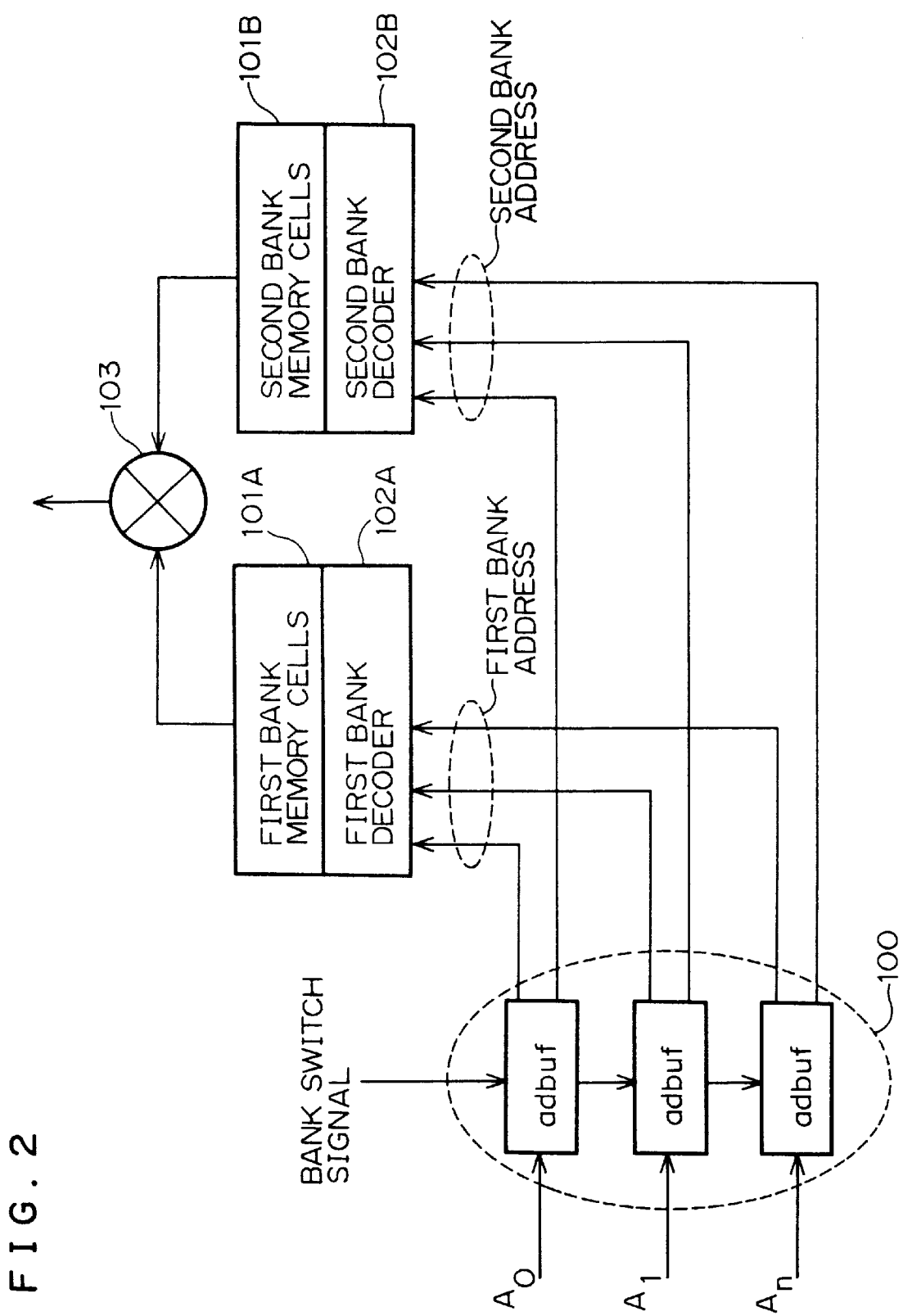
FIG. 2 is a block diagram of a flash memory in accordance with the first embodiment of the present invention.

FIG. 2 illustrates a flash memory in accordance with the first embodiment of the present invention.

The flash memory is designed to include a memory cell array comprised of memory cells arrange din two banks, and an address buffer circuit. In the flush memory, when data is erased from or written into one of the banks, data can be read out of the other bank. The address buffer circuit includes first and second signal paths through each of which an external address is transmitted to each of the banks for reading data therefrom, and through each of which a bank address is output from each of the banks for reading data therefrom, and a third signal path through which a latch address for data writing and an internal address for data erasing are transmitted.

Specifically, with reference to FIG. 2, the flash memory in accordance with the first embodiment is comprised of memory cells 101A and 110B arranged in first and second banks A and B, first and second bank decoders 102A and 102B associated with the memory cells 101A and 101B, respectively, a switch 103 selecting one of data read out of the memory cells 101A and 101B, and address buffer circuits 100 transmitting first bank addresses to the first bank decoders 102A and second bank addresses to the second bank decoders 102B.

One of the memory cells 101A and 101B is selected by the first and second decoders 102A and 102B in accordance with an address signal. Data read out of the memory cells 101A and 101B is output through the switch 103 in accordance with a bank switch signal by which one of the first and second banks A and B is selected.

As shown in Table 1, there are five combinations of operations simultaneously carried out by the first and second banks A and B with respect to data-reading, data-writing, and data-erasing.

TABLE 1

| | First Bank A | Second Bank B |
|---|---|---|
| 1 | Data-Reading | Data-Writing |
| 2 | Data-Reading | Data-Erasing |
| 3 | Data-Writing | Data-Reading |
| 4 | Data-Erasing | Data-Reading |
| 5 | Data-Erasing | Data-Erasing |

The address buffer circuit 100 receive both address signals A0 to An and a bank switch signal, and transmits the first and second bank addresses to the first and second decoders 102A and 102B, respectively, in accordance with the bank switch signal.

The first and second bank addresses transmitted from the address buffer circuits 100 include one of three addresses, that is, an external address, a latch address, and an internal address, in accordance with the combination of operations to be simultaneously carried out by the first and second banks A and B, illustrated in Table 1. Herein, the external address corresponds to data-reading, the latch address corresponds to data-writing, and the internal address corresponds to data-erasing.

The relation between the combination of operations to be simultaneously carried out by the first and second banks A and B and the three addresses is as shown in Table 2.

TABLE 2

|   | Address of First Bank A | Address of Second Bank B |
|---|---|---|
| 1 | External Address | Latch Address |
| 2 | External Address | Internal Address |
| 3 | Latch Address | External Address |
| 4 | Internal Address | External Address |
| 5 | Internal Address | Internal Address |

Figure 3:
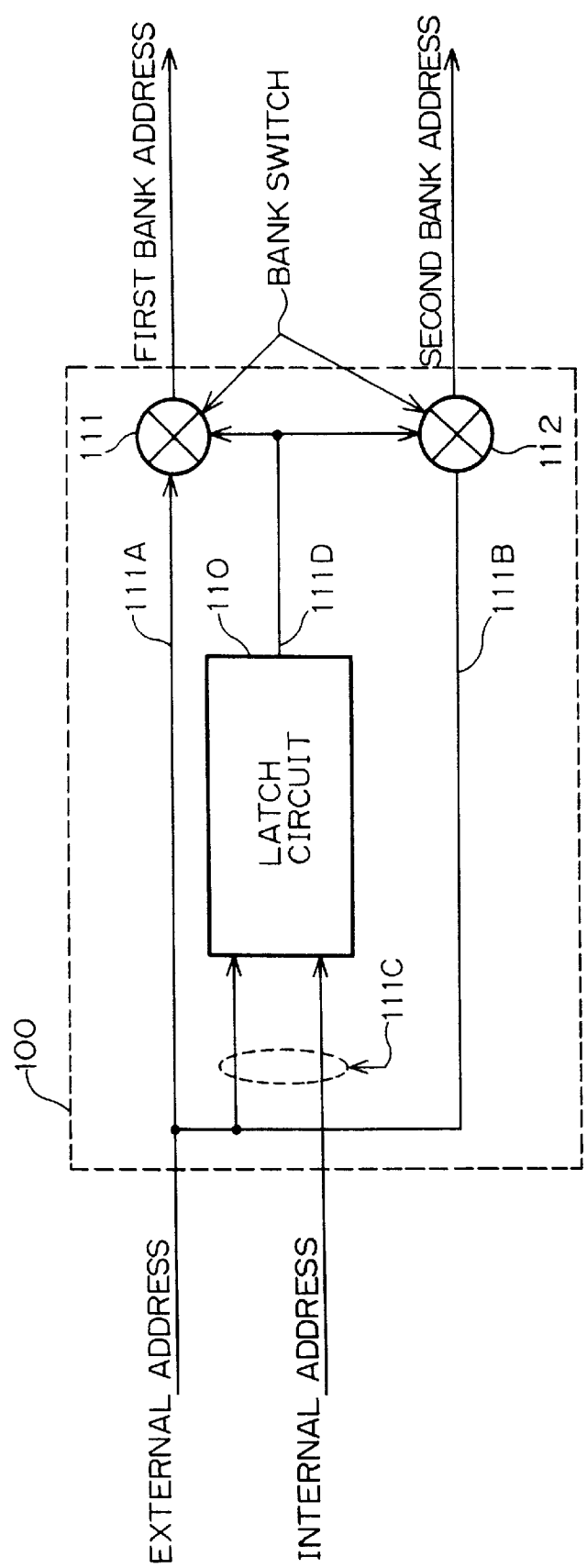
FIG. 3 is a block diagram of an address buffer circuit which is a part of the flash memory illustrated in FIG. 2.

FIG. 3 illustrates an example of the address buffer circuit 100.

the illustrated address buffer circuit 100 is comprised of a first switch 111 receiving an external address through a first address signal path 111A through which data is to be read out of the first bank A, a second switch 112 receiving an external address through a second address signal 111B path through which data is to be read out of the second bank B, and a latch circuit 110 alternatively receives an external address as an address for writing data or an internal address as an address for erasing data.

The latch circuit 100 transmits an output signal to the first and second switches 111 and 112. The first and second switches 111 and 112 receive a bank switch signal from a bank switch (not illustrated).

The first and second switches 111 and 112 transmit first and second switches 111 and 112. The first and second switches 111 and 112 receive a bank switch signal from a bank switch (not illustrated).

The first and second switches 111 and 112 transmit first and second bank addresses to the associated address decoders in accordance with the bank switch signal in dependence on whether each of the first and second banks A and B is in a data-reading operation, a data-writing operation, or a data-erasing operation. Herein, each of the first and second the bank addresses is comprised of an address for reading data, an address for writing data, or an address for erasing data.

The external address is input into one of input terminals of both the first and second switches 111 and 112 through both the first and second address signal paths 11A and 11B, and further into the latch circuit 110.

The latch circuit 110 receives the internal address as well as the external address through third address signal paths 111C formed separately from the first and second address signal paths 11A and 111B, and outputs one of the internal addresses and the latched external address to the other input terminal of both the first and second switches 111 and 112.

Each of the first and second switches 111 and 112 selects one of the external address input thereinto through one of the input terminals, and the internal or latched external address input thereinto through the other input terminal, and transmits the selected address as the first and second bank addresses.

Herein, the internal address is an address signal generated by means of a counter, for instance, within a chip, and is different from the externals address input from an external terminal.

As having been explained, in accordance with the first embodiment, the address buffer circuit 100 is designed to include only one latch circuit 100 for selecting one of the internal address and the latch address obtained by latching the external address. In addition, the latch circuit 100 receives the external and internal addresses through the third address signal paths 11C formed separately from the first and second address signal paths 111A and 111B. As a result, the flash memory in accordance with the first embodiment can be formed in a smaller size than a conventional one, and can switch the first and second banks A and B by means of the address buffer circuit 100 having a simplified structure. In addition, since the address buffer circuit 100 transmits the first and second bank addresses to the first and second banks A and B, a memory cell can be accessed at a higher rate.

With reference to FIG. 3, when data is to be read out of the first bank A and data is to be written into the second bank B, the first switch 111 transmits the external address as the first bank address in accordance with the bank switch signal, and the second switch 112 transmits the latch address, which is transmitted from the latch circuit 110 selecting one of the latch address and the internal address, as the second bank address in accordance with the bank switch signal.

When data is to be read out of the first bank A and data is to be erased from the second bank B, the first switch 111 transmits the external address as the first bank address in accordance with the bank switch signal, and the second switch 112 transmits the internal address, which is transmitted from the latch circuit 110 selecting one of the latch address and the internal address, as the second bank in accordance with the bank switch signal.

When data is to be written into the first bank A and data is to be read out of the second bank B, the first switch 111 transmits the latch address, which is transmitted from the latch circuit 110 selecting one of the latch address and the internal address, as the first bank address in accordance with the bank switch signal, and the second switch 112 transmits the external address as the second bank address in accordance with the bank switch signal.

When data is to be erased from the first bank A and the data is to be read out of the second bank B, the first switch 111 transmits the internal address, which is transmitted from the latch circuit 110 selecting one of the latch address and the internal address, as the first bank address in accordance with the bank switch signal, and the second switch 112 transmits the external address as the second bank address in accordance with the bank switch signal.

When data is to be erased from the first bank A and data is to be erased from the second bank B, the first switch 111 transmits the internal address, which is transmitted from the latch circuit 110 selecting one of the latch address and the internal address, as the first bank address in accordance with the bank switch signal, and the second switch 112 transmits the external address, which is transmitted from the latch circuit 110 selecting one of the latch address and the internal address, as the second bank address in accordance with the bank switch signal.

Figure 4:
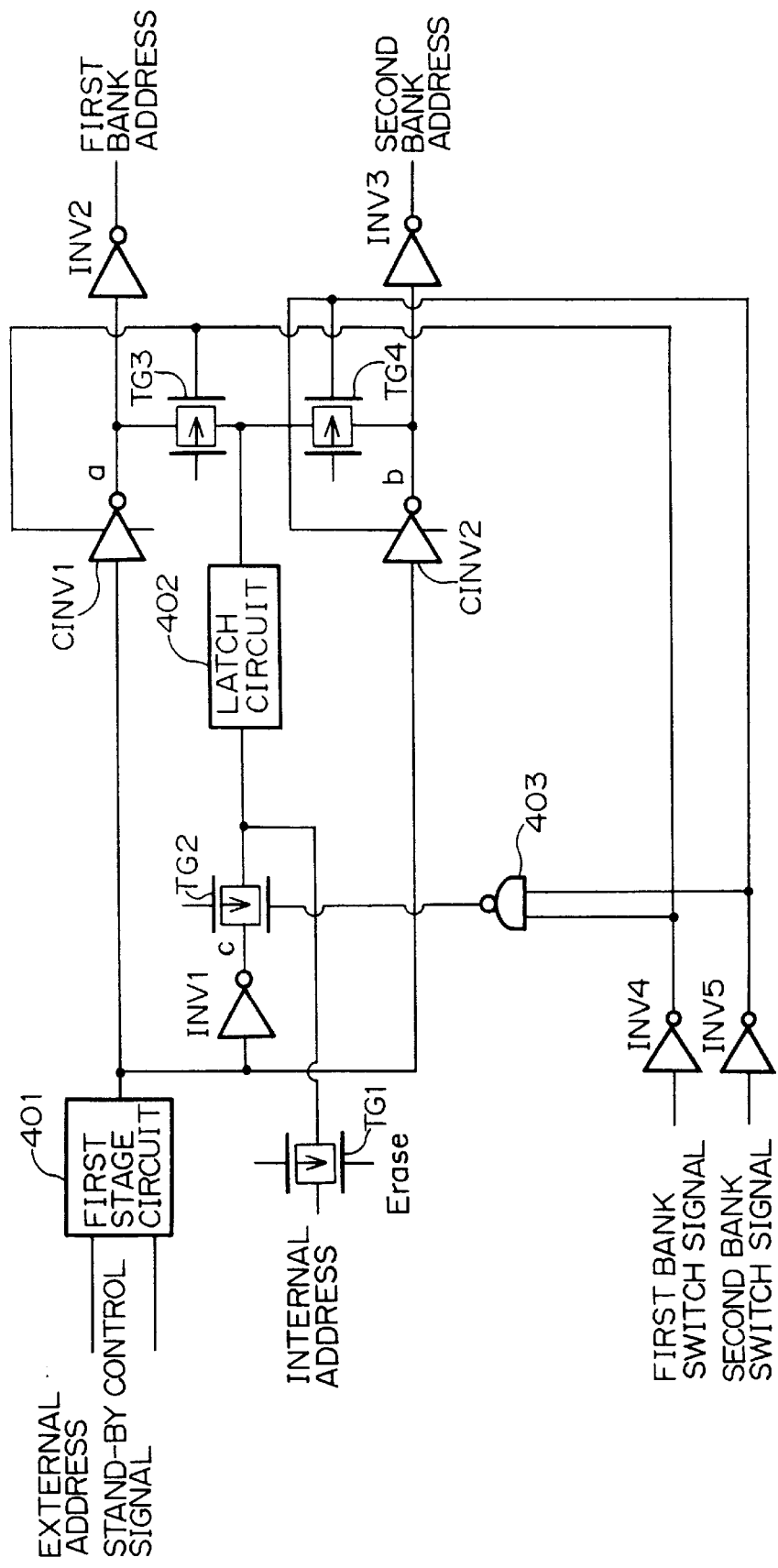
FIG. 4 is a block diagram of an example of the address buffer circuit.

FIG. 4 is a block diagram of an example of an address buffer circuit which selectively transmits a bank address to one of the first and second banks A and B. The address buffer circuit illustrated in FIG. 4 corresponds to one of the address buffer circuits 100 receiving the address signals A0 to An, illustrated in FIG. 2.

As illustrated in FIG. 4, the address buffer circuit is comprised of a first stage circuit 401, a latch circuit 402, a first transfer gate TG1, a second transfer gate TG2, a third transfer gate TG3, a fourth transfer gate TG4, a first inverter INV1, a second inverter INV2, a third inverter INV3, a fourth inverter INV4, a fifth inverter INV5, a first clocked inverter CINV1, a second clocked inverter CINV2, and a NOR circuit 403.

The first stage circuit 401 receives both an external address signal and a stand-by control signal which is a signal for suppressing a current form running through the first stage circuit 401 in a stand-by mode. When the stand-by control signal is activated, the first stage circuit 401 disallows a current from running therethrough regardless of an input level of the external address.

An output signal transmitted from the first stage circuit 401 is branched into three portions, which are directed towards the first bank A, the second bank B, and the latch circuit 402. Specifically, the output signal transmitted from the first stage circuit 401 is input into an input terminal of the second inverter INV2 through the first clocked inverter CINV1, further into an input terminal of the latch circuit 402 through the first inverter INV1 and the second transfer gate TG2, and still further into an input terminal of the third inverter INV3 through the second clocked inverter CINV2.

Figure 5A:
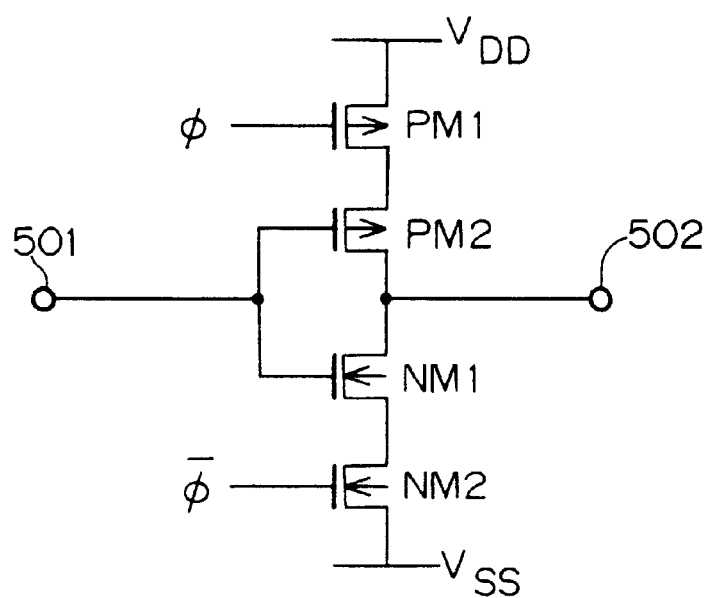
FIG. 5A is a block diagram of an example of a clocked inverter.

FIG. 5A is a block diagram of an example of a clocked inverter. As illustrated, the clocked inverter is comprised of a first p-channel MOS transistor PM1, a second p-channel MOS transistor PM2, a first n-channel MOS transistor NM1, and a second n-channel MOS transistor NM2 all of which is electrically connected in series between a high level power source VDD and a low level power source VSS. The second p-channel MOS transistor PM2 and the first n-channel MOS transistor NM1 have gates commonly connected to an input terminal 501 and drains commonly connected to an output terminal 502. The second p-channel MOS transistor PM2 and the first n-channel MOS transistor NM1 cooperates with each other to define a CMOS inverter.

A control signal $\phi_1$ is input into a gate of the first p-channel MOS transistor PM1, and a control signal $\phi_2$ is input into a gate of the second n-channel MOS transistor NM2. The control signals $\phi_1$ and $\phi_2$ are complementary with each other. The clocked inverter is turned on when the control signals $\phi_1$ is in a low level, and turned off when the control signals $\phi_1$ is in a high level.

Figure 5B:
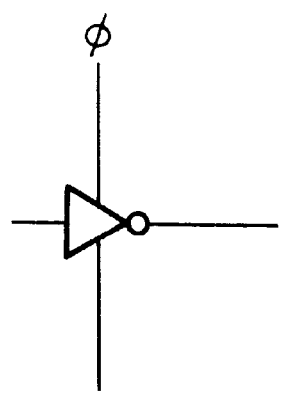
FIG. 5B is a block diagram of another example of a clocked inverter.

In FIG. 4, only the control signals $\phi_1$ input into a gate of the first p-channel MOS transistor PM1 is illustrated in accordance with such an illustration rule as illustrated in FIG. 5B, and the complementary control signal $\phi_2$ to be input to a gate of the second n-channel MOS transistor NM2 is not illustrated.

Referring back to FIG. 4, a first bank switch signal having been inverted by the fourth inverter INV4 is input into a gate of the first p-channel MOS transistor PM1 in the first clocked inverter CINV1, and a signal complementary with the inverted first bank switch signal is input into a gate of the second n-channel complementary with the first bank switch signal have the same logic.

The first clocked inverter CINV1 is turned on when data is to be read out of the first bank A, or when the first bank switch is inactivated, namely, is in a high level, and turned off when the first bank switch is activated, namely, is in a low level.

A second bank switch signal having been inverted by the fifth inverter INV5 is input into a gate of the first p-channel MOS transistor PM1 in the second clocked inverter CINV2, and a signal complementary with the inverted second bank switch signal is input into a gate of the second n-channel MOS transistor NM2. Herein, the second bank switch signal and the signal complementary with the second bank switch signal have the same logic.

The second clocked inverter CINV2 is turned on when data is to be read out of the second bank B, or when the second bank switch is inactivated, namely, is in a high level, and turned off when the second bank switch is activated, namely, is in a low level.

The second transfer gate TG2 is comprised of a p-channel MOS transistor and an n-channel MOS transistor electrically connected in parallel with each other.

The NOR circuit 403 receives both the first bank switch signal having been inverted by the fourth inverter INV4 and the second bank switch signal having been inverted by the fifth inverter INV5, and transmits NOR of those signals to a gate of the n-channel MOS transistor in the second transfer gate TG2, as a bank switch. A signal obtained by inverting an output transmitted from the NOR circuit 403 is input into a gate of the p-channel MOS transistor in the second transfer gate TG2.

The output signal transmitted from the NOR circuit 403 is in a high level, and the second transfer gate TG2 is turned on, when both the first and second bank switch signals are inactivated, namely, in a high level, or when data is to be read out of both the first and second banks. The second transfer gate TG2 is turned off in cases except when both the first and second bank switch signals are inactivated.

The second and third inverters INV2 and INV3 transmit first and second bank addresses to the first and second bank decoders 102A and 102B (see FIG. 2), respectively.

The latch circuit 402 transmits an output signal to input terminals of the second and third inverters INV2 and INV3 through the third and fourth transfer gates TG3 and TG4, respectively.

A first signal obtained by inverting the first bank switch signal by means of the fourth inverter INV4 is input into a gate of the n-channel MOS transistor in the third transfer gate TG3, and a second signal obtained by inverting the first signal is input into a gate of the p-channel MOS transistor in the third transfer gate TG3. The third transfer gate TG3 is turned on when the first bank switch signal is activated, namely, in a low level.

A third signal obtained by inverting the second bank switch signal by means of the fifth inverter INV5 is input into a gate of the n-channel MOS transistor in the fourth transfer gate TG4, and a fourth signal obtained by inverting the third signal is input into a gate of the p-channel MOS transistor in the fourth transfer gate TG4. The fourth transfer gate TG4 is turned on when the second bank switch signal is activated, namely, in a low level.

The internal address signal is input into an input terminal of the latch circuit 402 through the first transfer gate TG1.

A data-erase signal is input into a gate of an n-channel MOS transistor of the first transfer gate TG1, and a signal complementary with the data-erase signal is input into a gate of a p-channel MOS transistor of the first transfer gate TG1. When the data-erase signal is activated, that is, in a high level, the first transfer gate TG1 is turned on.

In FIG. 4, there are illustrated only control signals to be input into gates of the n-channel MOS transistors in the first to fourth transfer gates TG1 to TG4, and there are not illustrated the complementary signals obtained by inverting the control signals, to be input into gates of the p-channel MOS transistors in the first to fourth transfer gates TG1 to TG4.

When data is to be read out of the first bank, an output transmitted from the first clocked inverter CINV1 being turned on is output from the second inverter INV2 as the first bank address. On the other hand, when data is to be read out of the second bank, an output transmitted from the second clocked inverter CINV2 being turned on is output from the third inverter INV3 as the second bank address.

When either the latched external address or the internal address is input into the first bank, the first clocked inverter CINV1 is turned off, and the third transfer gate TG3 is turned on. When either the latched external address or the internal address is input into the first bank, the second clocked inverter CINV2 is turned off, and the fourth transfer gate TG4 is turned on.

The external address, the latch address and the internal address all pass a line D, which is an output node of the latch circuit 402. When data is to be written into or erased from the flush memory, an output signal for doing so is directed to the third or fourth transfer gate TG3 or TG4 at the node D in accordance with the first and second bank switch signals.

The first and second bank addresses are transmitted to the first and second bank decoders 102A and 102B, respectively. Thus, it is possible to independently control the first and second banks to thereby concurrently carry out operations of data-writing and data-reading, in accordance with the first and second bank addresses.

Figure 6:
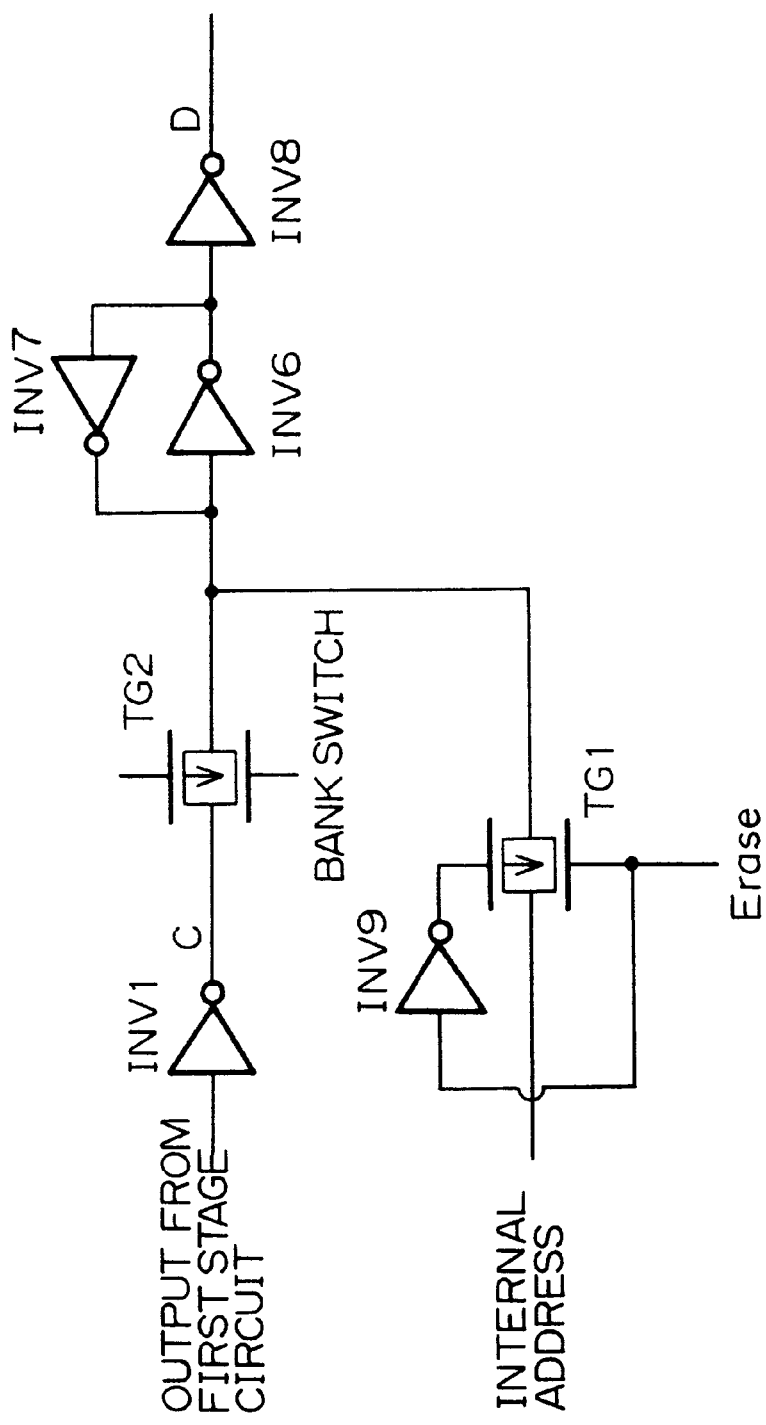
FIG. 6 is a partial block diagram of the address buffer circuit illustrated in FIG. 4.

FIG. 6 is a block diagram of the latch circuit 402 and the first transfer gate TG1 to which the internal address is input.

The latch circuit 402 is comprised of a sixth inverter INV6, a seventh inverter INV7, and an eighth INV8. An output terminal of the sixth inverter INV6 is electrically connected to an input terminal of the seventh inverter INV7, and an output terminal of the seventh inverter INV6 is electrically connected to an output terminal of the sixth inverter INV6. The sixth and seventh inverters INV6 and INV7 define a flip-flop circuit. The eighth inverter INV8 receives an output transmitted from the sixth inverter INV6, as an input.

The data-erase signal is input into a gate of an n-channel MOS transistor in the first transfer gate TG1, and a signal obtained by inverting the data-erase signal by means of a ninth inverter INV9 is input into a gate a p-channel MOS transistor in the first transfer gate TG1. When the data-erase signal is in a high level, the first transfer gate TG1 is turned on, and resultingly, the internal address is transmitted to the latch circuit 402.

The latch address for data-writing and the internal address for data-erasing are switched at the nodes C and D in FIG. 6.

When data is to be written into the memory, the bank switch signal is activated, that is, an output signal transmitted from the NOR circuit 403 is in a low level, and the second transfer gate TG2 is turned off, and resultingly, the external address latched by the latch circuit 402 is transmitted to the line D.

When data is to be erased from the memory, the bank switch signal transmitted from the NOR circuit 403 is in a low level, the data-erase flag is activated, or is in a high level, the second transfer gate TG2 is turned off, and the first transfer gate TG1 is turned on. Thus, the internal address latched by the latch circuit 402 is transmitted to the line D.

Figure 7:
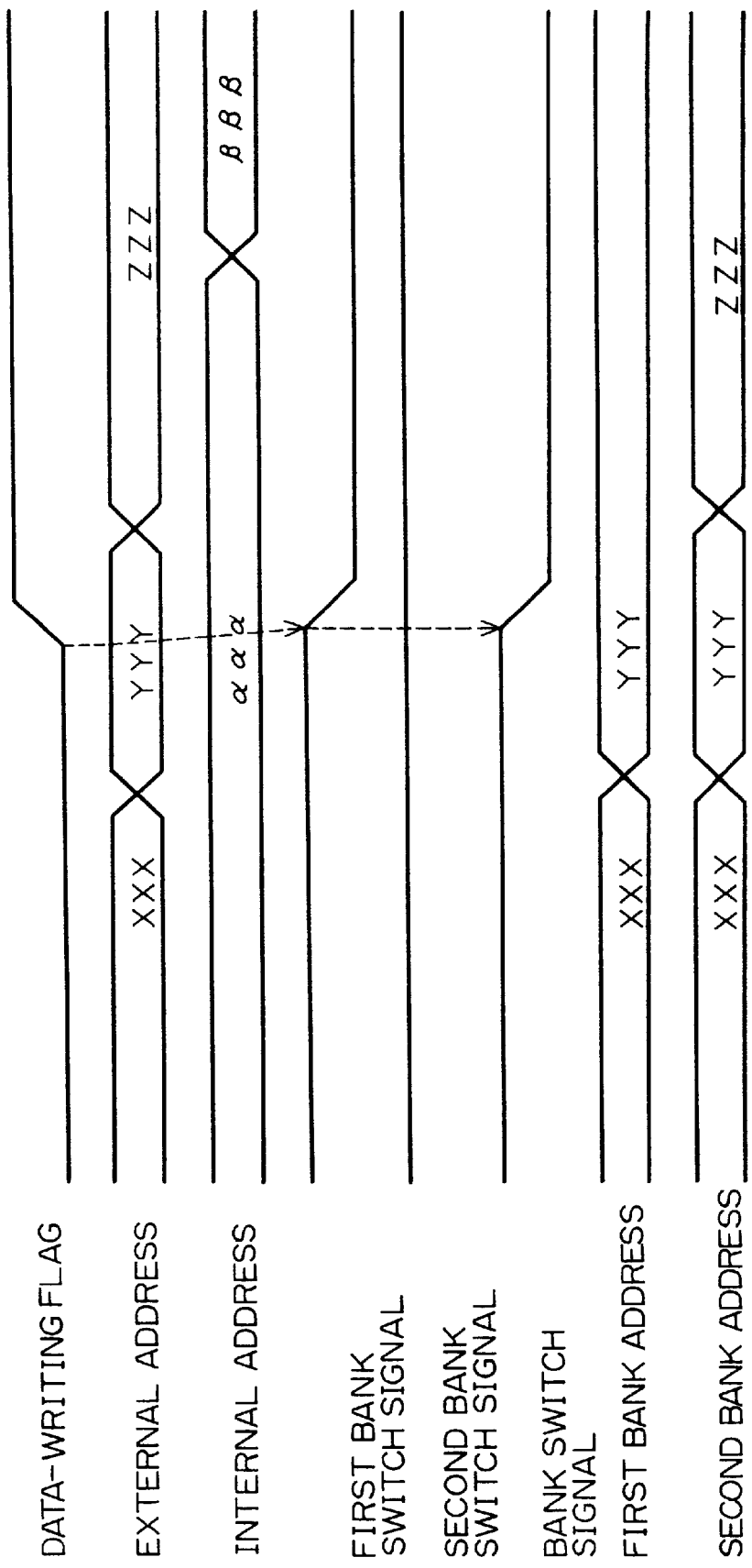
FIG. 7 is a timing chart of an operation of the address buffer circuit illustrated in FIG. 4.

FIG. 7 is a timing chart of the address buffer circuit illustrated in FIG. 4. In FIG. 7, it is assumed that data is written into the first bank, that is, the first bank switch signal is in a low level, and data is read out of the second bank, that is, the second bank switch signal is in a high level. The operation of writing data into the first bank is simultaneously carried out with the operation of reading out of the second bank.

Hereinbelow is explained these operations to be simultaneously carried out in the address buffer circuit illustrated in FIG. 4, with reference to FIG. 7. Hereinbelow, a data-writing flag is a signal for controlling data-writing into each of the banks.

First, the first and second bank switch signals are both inactivated, that is, are in a high level. The bank switch signal transmitted from the NOR circuit 403 which receives the inverted first and second bank switch signals as input signals is in a high level. The second transfer gate TG2 is turned on, and the first transfer gate TG1 is turned off. The external address transmitted from the first stage circuit 401 is input into the latch circuit 402 through the second transfer gate TG2, and latched in the latch circuit 402.

Then, the data-writing flag is activated. As a result, the first bank switch signal is activated, that is, is in a low level, the first clocked inverter CINV1 is turned off, and the third transfer gate TG3 is turned on. Thus, the latch address is transmitted from the second inverter INV2 to the first bank through the third transfer gate TG3, whereas the external address is transmitted as it is from the third inverter INV3 to the second bank through the fourth transfer gate TG4.

As the first bank address signal, there is transmitted the latch address "YYY" which is a latch address obtained when the data-writing flag is activated. As the second bank address signal, there is transmitted the same code as the external address.

Figure 8:
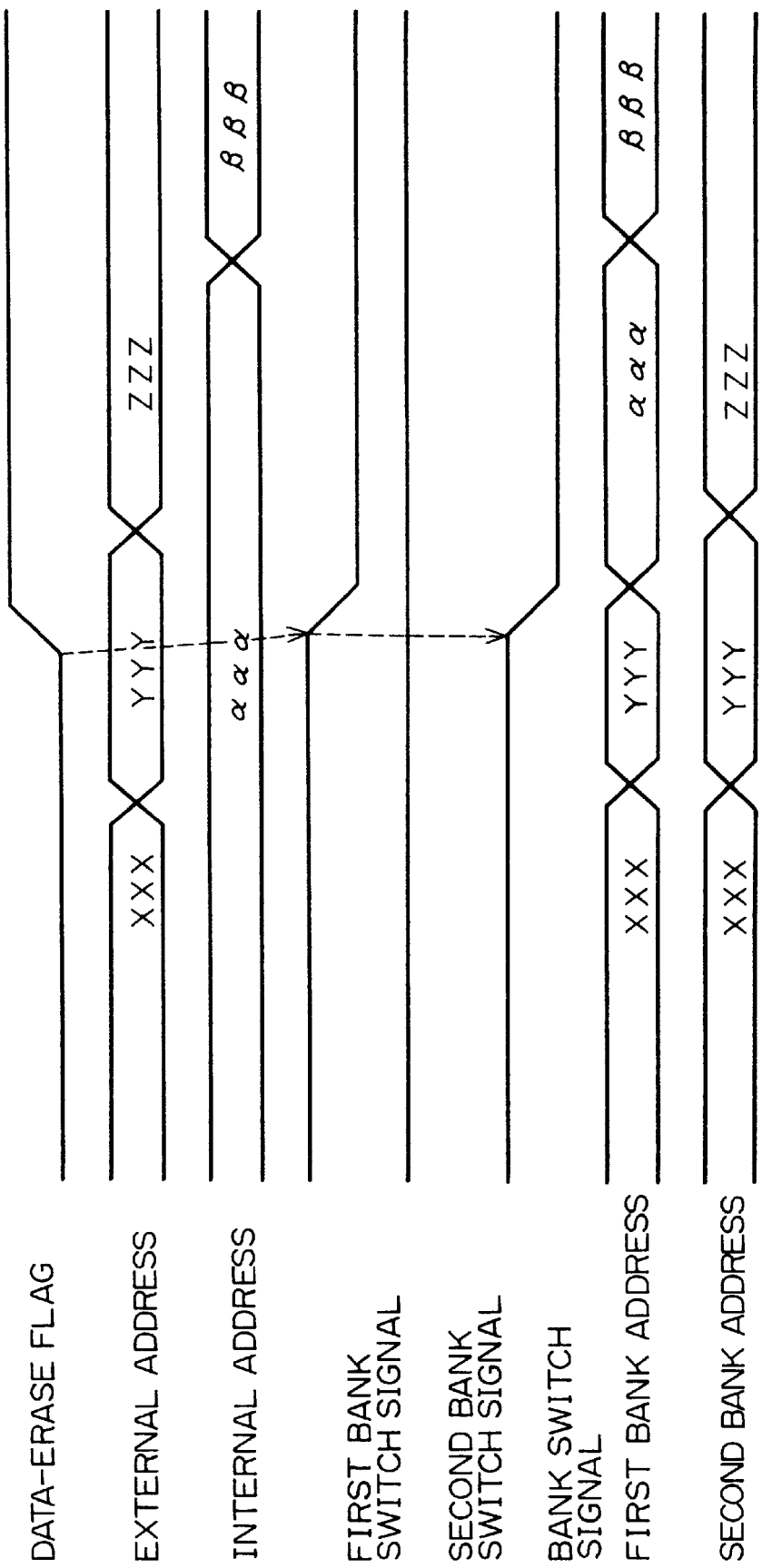
FIG. 8 is another timing chart of an operation of the address buffer circuit illustrated in FIG. 4.

FIG. 8 is a timing chart of the address buffer circuit illustrated in FIG. 4. In FIG. 8, it is assumed that data is erased from the first bank, and data is read out of the second bank. The operation of erasing data from the first bank is simultaneously carried out with the operation of reading out of the second bank.

When the data-erasing flag is activated, the first bank switch signal is activated, that is, in a low level, and the second transfer gate TG2 is turned off. The internal address is input into the latch circuit 402 through the first transfer gate TG1, which is turned on.

In addition, when the data-erasing flag is activated, the first bank switch signal is activated, that is, in a low level, and the third transfer gate TG3 is turned on. The internal address transmitted from the latch circuit 402 is supplied to the second inverter INV2 through the third transfer gate TG3.

Then, the internal address is transmitted to the first bank, and the external address is transmitted as it is to the second bank through the second clocked inverter INV2. That is, the internal addresses "ααα" and "βββ" which are internal addresses to be obtained after the data-erasing flag has been activated are transmitted as the first bank address, and the same code as the external address is transmitted as the second bank address.

Figure 9:
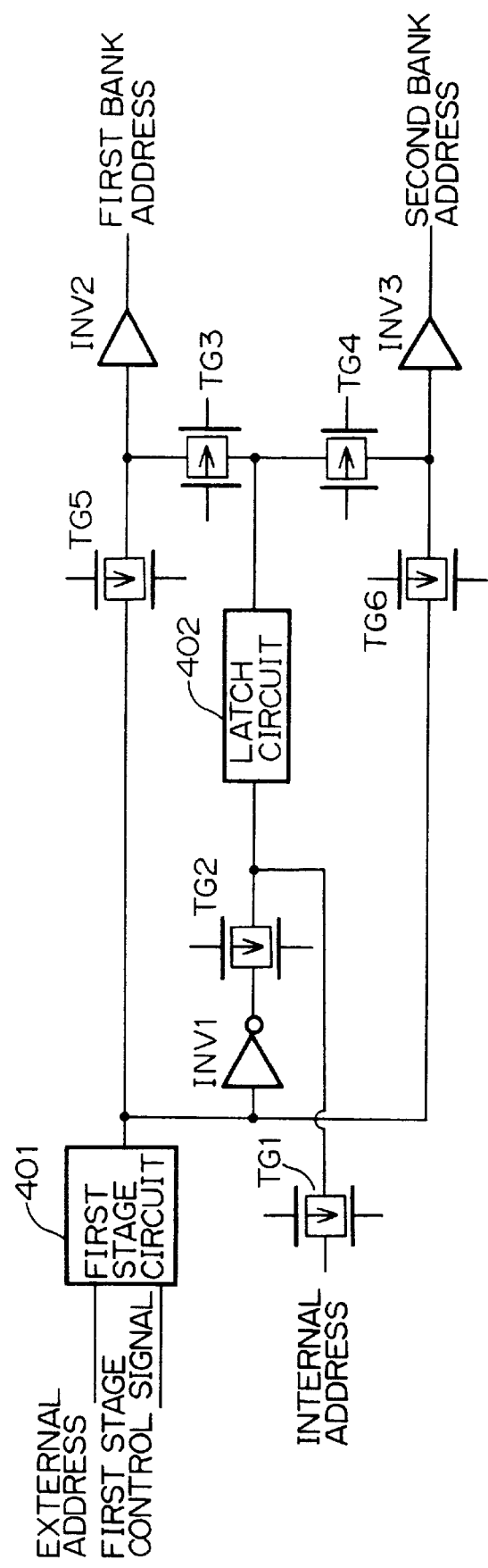
FIG. 9 is a block diagram of another example of the address buffer circuit.

FIG. 9 is a block diagram of a second example of the address buffer circuit. In FIG. 9, parts or elements that correspond to those of the address buffer circuit illustrated in FIG. 4 have been provided with the same reference numerals.

The illustrated address buffer circuit includes fifth and sixth CMOS transfer gates TG5 and TG6 in place of the first and second clocked inverters CINV1 and CINV2, in comparison with the address buffer circuit illustrated in FIG. 4.

As an alternative, there may be used n-channel MOS transistors in place of the fifth and sixth CMOS transfer gates TG5 and TG6.

Hereinbelow is explained a third example of the address buffer circuit. In the above-mentioned first and second examples, the external address and the internal address are switched only in the latch circuit 402 to thereby ensure a high-rate access and reduction in a size of the memory. These advantages can be obtained by simultaneously carrying out the operation of data-writing, data-reading or data-erasing, in each of the banks.

Figure 10:
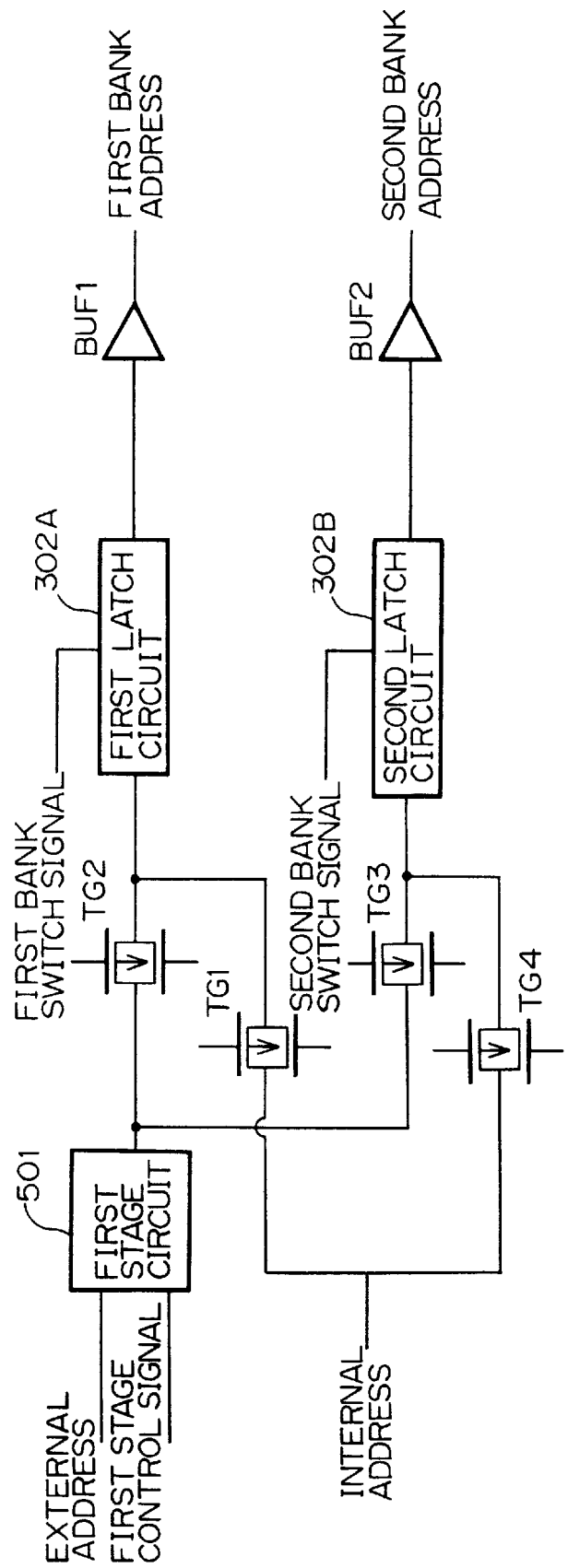
FIG. 10 is a block diagram of still another example of the address buffer circuit.

FIG. 10 is a block diagram of a third example of the address buffer circuit.

The illustrated address buffer circuit is comprised of a first stage circuit 501 receiving both an external address and a first stage control signal, a first transfer gate TG1 which is turned on or off in accordance with a data-erasing flag, a second transfer gate TG2 which is turned on or off in accordance with a first bank switch signal, a third transfer gate TG3 which is turned on or off in accordance with a second bank switch signal, a fourth transfer gate TG4 which is turned on or off in accordance with a data-erasing flag, first and second latch circuits 502A and 502B, and first and second buffers BUF1 and BUF2.

With reference to FIG. 10, the first stage circuit 501 transmits an output signal to an input terminal of the first latch circuit 502A through the second transfer gate TG2, and further to an input terminal of the second latch circuit 502B through the third transfer gate TG3.

An internal address is input into the input terminals of the first and second latch circuits 502A and 502B through the first and fourth transfer gates TG1 and TG4, respectively. The first and second latch circuits 502A and 502B transmit outputs to the first and second bank decoders 102A and 102B through the first and second buffers BUF1 and BUF2, as the first and second bank addresses, respectively.

In the third example, the latch circuits 502A and 502B are associated with the first and second banks. Accordingly, different addresses can be latched for the first and second banks, ensuring carrying out data-reading operation in one of the banks while data-writing operation or data-erasing operation is being carried out in the other bank.

In accordance with the third example, since different addresses can be latched to the first and second banks, or since different internal addresses can be input into the first and second banks, it would be possible to simultaneously carry out an operation of data-writing in one of the banks and an operation of data-erasing in the other bank.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-233567 filed on Aug. 20, 1999 including specification, claims, drawings and summary is incorporated herein by reference in its entirely.

What is claimed is:

1. A semiconductor memory device comprising:
   (a) a plurality of address recorders each associated with each of a plurality of banks; and
   (b) at least one address buffer circuit receiving an address signal as an input signal, and transmitting a bank address signal to each of said address recorders,
   said address buffer circuit transmitting a first address signal for reading data, a second address signal for writing data, or a third signal for erasing data to each of said banks in accordance with an operation of reading data, an operation of writing data, or an operation of erasing data to be carried out by each of said banks.

2. The semiconductor memory device as set forth in claim 1, further comprising a latch circuit, and wherein said second address signal is comprised of a latch address obtained by latching an externally input address signal by means of said latch circuit, and said third address signal is comprised of an internal address generated in said semiconductor memory device, said latch circuit switching and latching said latch and internal addresses.

3. The semiconductor memory device as set forth in claim 1, further comprising a latch circuit, and wherein each of said first and second address signals is comprised of a latch address obtained by latching an externally input address signal by means of said latch circuit, and said third address signal is comprised of an internal address generated in said semiconductor memory device, said latch circuit switching and latching said latch and internal addresses.

4. The semiconductor memory device as set forth in claim 1, wherein said semiconductor memory device is an electrically erasable and programmable read only memory (EEPROM).

5. A non-volatile semiconductor memory device including a memory cell array arranged in a plurality of banks such that while data is erased from or written into one of said banks, data can be read out of one of the rest of said banks, said non-volatile semiconductor memory device comprising:
   (a) a first switch receiving an external address through a first address signal path through which data is to be read out of a first bank;
   (b) a second switch receiving an external address through a second address signal path through which data is to be read out of a second bank; and
   (c) a latch circuit alternatively receives an external address as an address for writing data or an internal address as an address for erasing data,
   an address transmitted from said latch circuit being supplied to both said first and second switches,
   each of said first and second switches including an address buffer circuit which transmits a bank address to an address decoder associated with each of said banks in accordance with a control signal transmitted from each of said banks, in dependence on whether each of said banks is in a data-reading operation, a data-writing operation, or a data-erasing operation,
   said bank address being comprised of an address for reading data, an address for writing data, or an address for erasing data.

6. The non-volatile semiconductor memory device as set forth in claim 5, wherein said semiconductor memory device is an electrically erasable and programmable read only memory (EEPROM).

7. A non-volatile semiconductor memory device including a memory cell array comprised of first and second banks such that while data is erased from or written into one of said first and second banks, data can be read out of the other, said non-volatile semiconductor memory device comprising:
   (a) first and second signal paths through each of which an external address is transmitted to each of said banks as an address for data-reading; and
   (b) a third signal path through which said external address or a latch address obtained by latching an internal address for data-erasing, by means of a latch circuit, is transmitted, an output transmitted through said third signal path being transmitted to an associated bank through an output terminal of at least one of said first and second signal paths, as an address, when data is to be written into or erased form said bank.

8. The non-volatile semiconductor memory device as set forth in claim 7, wherein said semiconductor memory device is an electrically erasable and programmable read only memory (EEPROM).

9. A non-volatile semiconductor memory device including a memory cell array comprised of first and second banks such that while data is erased from or written into one of said first and second banks, data can be read out of the other, said non-volatile semiconductor memory device comprising:
(a) a first switch which is turned on when data is read out of said first bank and turned off when data is written into or erased from said first bank;
(b) a second switch which is turned on when data is read out of said second bank and turned off when data is written into or erased from said second bank;
(c) a third switch which is turned on when data is read out of both said first and second banks;
(d) a fourth switch which is turned on when data is erased from said first and/or second bank;
(e) a fifth switch which is turned on when data is written into or erased from said first bank;
(f) a sixth switch which is turned on when data is written into or erased from said second bank;
(g) a latch circuit; and
(h) an address buffer circuit including a first buffer circuit and a second buffer circuit, each of said first and second buffer circuits transmitting a bank address to each of address decoders associated with said first and second banks, an externally input address being transmitted to an input terminal of said first buffer circuit through said first switch in accordance with a first bank switch signal, and further transmitted to an input terminal of said second buffer circuit through said second switch in accordance with a second bank switch signal, said externally input address being transmitted to an input terminal of said latch circuit through said third switch in accordance with said first and second bank switch signals, an internal address being transmitted to an input terminal of said latch circuit through said fourth switch in accordance with a control signal, an output signal being transmitted from said latch circuit to an input terminal of said first buffer circuit through said fifth switch in accordance with said first bank switch signal, and further transmitted to an input terminal of said second buffer circuit through said sixth switch in accordance with said second bank switch signal.

10. The non-volatile semiconductor memory device as set forth in claim 9, wherein each of said first and second switches is comprised of a clocked inverter.

11. The non-volatile semiconductor memory device as set forth in claim 9, wherein each of said first to sixth switches is comprised of a transfer gate.

12. The non-volatile semiconductor memory device as set forth in claim 9, wherein said semiconductor memory device is an electrically erasable and programmable read only memory (EEPROM).

13. A non-volatile semiconductor memory device including a memory cell array comprised of first and second banks, said non-volatile semiconductor memory device comprising:
(a) a first switch which is turned on when data is read out of said first bank and turned off when data is written into or erased form said first bank;
(b) a second switch which is turned on when data is read out of said second bank and turned off when data is written into or erased form said second bank;
(c) a third switch which is turned on when data is erased from said first and/or second banks;
(d) a fourth switch which is turned on when data is erased from said first and/or second bank;
(e) a first latch circuit;
(f) a second latch circuit; and
(g) an address buffer circuit including a first buffer circuit and a second buffer circuit, said first and second buffer circuits having input terminals electrically connected to output terminals of said first and second latch circuits, respectively, each of said first and second buffer circuits transmitting a bank address to each of address decoders associated with said first and second banks, respectively, an externally input address being transmitted to an input terminal of said first latch circuit through said first switch in accordance with a first bank switch signal, and further transmitted to an input terminal of said second latch circuit through said second switch in accordance with a second bank switch signal, an internal address being transmitted to each of input terminals of said first and second latch circuits through said third and fourth switches, respectively, in accordance with a control signal.

14. The non-volatile semiconductor memory device as set forth in claim 13, wherein said semiconductor memory device is an electrically erasable and programmable read only memory (EEPROM).

\* \* \* \* \*